(12) United States Patent
Jiang et al.

(10) Patent No.: US 8,908,386 B2
(45) Date of Patent: Dec. 9, 2014

(54) PRINTED CIRCUIT BOARD ASSEMBLY CHIP PACKAGE COMPONENT AND SOLDERING COMPONENT

(75) Inventors: Zhiwei Jiang, Shenzhen (CN); Xiaochen Chen, Shenzhen (CN); Zhipeng Guo, Xi'an (CN)

(73) Assignee: Huawei Device Co., Ltd., Shenzhen (CN)

( * ) Notice: Subject to any disclaimer, the term of this patent is extended or adjusted under 35 U.S.C. 154(b) by 282 days.

(21) Appl. No.: 13/564,483

(22) Filed: Aug. 1, 2012

(65) Prior Publication Data

US 2012/0295454 A1 Nov. 22, 2012

Related U.S. Application Data

(63) Continuation of application No. PCT/CN2011/070120, filed on Jan. 10, 2011.

(30) Foreign Application Priority Data

Feb. 1, 2010 (CN) .......................... 2010 1 0104540

(51) Int. Cl.
  *H05K 7/10* (2006.01)
  *H05K 1/11* (2006.01)
  *H05K 1/14* (2006.01)
  *H05K 3/22* (2006.01)
(52) U.S. Cl.
  CPC ................ *H05K 1/111* (2013.01); *H05K 1/112* (2013.01); *H05K 1/141* (2013.01); *H05K 3/225* (2013.01); *H05K 2201/09072* (2013.01); *H05K 2201/09381* (2013.01); *H05K 2201/0939* (2013.01); *H05K 2201/09663* (2013.01); *H05K 2203/042* (2013.01)
  USPC .......................................... 361/767; 174/260

(58) Field of Classification Search
  CPC ........... H01L 2924/15311; H01L 2924/15313; H01L 2924/1532; H01L 2924/15321; H01L 2924/15323; H01L 2924/1533; H01L 2924/15331; H01L 2924/15333; H01L 2224/16; H01L 2224/17; H05K 1/111; H05K 1/112; H05K 1/141; H05K 2201/09072; H05K 2201/10734; H05K 2201/09381; H05K 3/225; H05K 2203/042
  USPC .................................. 174/260; 361/760, 767
  See application file for complete search history.

(56) References Cited

U.S. PATENT DOCUMENTS 3,770,874 A     11/1973  Krieger et al.
6,159,608 A *  12/2000  Friedman et al. ............. 428/442

(Continued)

FOREIGN PATENT DOCUMENTS

CN         101005732 A      7/2007
WO     WO 00/19532 A1      4/2000

OTHER PUBLICATIONS

Extended European Search Report issued in corresponding European Patent Application No. 11736603.9, mailed Jan. 14, 2013.

(Continued)

*Primary Examiner* — Hoa C Nguyen
(74) *Attorney, Agent, or Firm* — Brinks Gilson & Lione

(57) ABSTRACT

A printed circuit board assembly (PCBA) chip package component includes: a module board and an interface board. A first soldering pad is set on the bottom of the module board, a second soldering pad is set on top of the interface board, and the second soldering pad is of a castle-type structure. The first soldering pad includes a first soldering area, a second soldering area, and a connection bridge that connects the first soldering area and the second soldering area. The first soldering area corresponds to a top surface of the second soldering pad, and when the first soldering area is soldered to second soldering pad, the second soldering area is located outside the second soldering pad.

12 Claims, 2 Drawing Sheets

(56) References Cited

U.S. PATENT DOCUMENTS

| | | | | |
|---|---|---|---|---|
| 7,213,740 | B2* | 5/2007 | Rinne | 228/180.22 |
| 7,223,921 | B2* | 5/2007 | Rissing et al. | 174/254 |
| 7,489,518 | B2* | 2/2009 | Matsuda | 361/767 |
| 8,507,805 | B2* | 8/2013 | Fujii | 174/260 |
| 2002/0125043 | A1 | 9/2002 | Yoshida | |
| 2002/0149102 | A1* | 10/2002 | Hashemi et al. | 257/706 |
| 2003/0047348 | A1* | 3/2003 | Jessep et al. | 174/250 |
| 2004/0124007 | A1* | 7/2004 | Ashida | 174/260 |
| 2007/0165389 | A1 | 7/2007 | Ahn | |

OTHER PUBLICATIONS

Office Action issued in corresponding Chinese Patent Application No. 201010104540.6, mailed Mar. 14, 2012.

International Search Report and Written Opinion of the International Searching Authority issued in corresponding PCT Patent Application No. PCT/CN2011/070120, mailed Apr. 21, 2011.

* cited by examiner

PRINTED CIRCUIT BOARD ASSEMBLY CHIP PACKAGE COMPONENT AND SOLDERING COMPONENT

CROSS-REFERENCE TO RELATED APPLICATION

This application is a continuation of International Application No. PCT/CN2011/070120, filed on Jan. 10, 2011, which claims priority to Chinese Patent Application No. 201010104540.6, filed on Feb. 1, 2010, both of which are hereby incorporated by reference in their entireties.

FIELD OF THE APPLICATION

The present application relates to the field of circuits, and in particular, to a printed circuit board assembly chip package component and a soldering component.

BACKGROUND OF THE APPLICATION

In current electronic products, the level of integration becomes higher and higher, so that the product cost of a terminal must be strictly controlled.

In order to reduce the cost effectively, a design scheme of a highly integrated module appears in the prior art, and the scheme can be applied to all types of user terminal products. Taking mobile phones for example, functions of hardware of most mobile phones are substantially the same. Some core components on a single board may be integrated in a larger module, and then the module is soldered on different printed circuit boards (PCB, Printed Circuit Board) so as to satisfy different demands.

The soldered modules in the prior art are generally packaged in two manners. One is adopting a land grid array (LGA, Land Grid Array) package manner, and the other is adopting a castle-type package manner.

However, in the prior art, the highly integrated module has many pins, and accordingly has a large number of soldering pads. After a chip package module is soldered on the PCB by adopting the soldering manner in the prior art, when some soldering pads need to be repaired because a phenomenon such as insufficient soldering and missing soldering occurs, the entire module needs to be taken down from the PCB board for re-soldering. However, the process of disassembling and assembling of the module may affect a chip on the module, and therefore, the chip packaging manner in the prior art does not facilitate repairing.

SUMMARY OF THE APPLICATION

Embodiments provide a printed circuit board assembly (PCBA, Printed Circuit Board Assembly) chip package component and a soldering component, which can facilitate repairing of a PCBA chip package module.

The printed circuit board assembly chip package component provided in an embodiment includes: a module board and an interface board. A first soldering pad is set on the bottom of the module board, a second soldering pad is set on top of the interface board, and the second soldering pad is of a castle-type structure. The first soldering pad includes a first soldering area, a second soldering area, and a connection bridge that connects the first soldering area and the second soldering area. The first soldering area corresponds to a top surface of the second soldering pad, and when the first soldering area is soldered to second soldering pad, the second soldering area is located outside the second soldering pad.

The soldering component provided in an embodiment includes: a first soldering pad and a second soldering pad. The second soldering pad is of a castle-type structure. The first soldering pad includes a first soldering area, a second soldering area, and a connection bridge that connects the first soldering area and the second soldering area. The first soldering area corresponds to a top surface of the second soldering pad, and when the first soldering area is soldered to second soldering pad, the second soldering area is located outside the second soldering pad.

From the foregoing technical solutions, it can be seen that the embodiments have the following advantages.

In the embodiments, the first soldering pad on the bottom of the module board is divided into two soldering areas, where the first soldering area is soldered to the top surface of the second soldering pad on top of the interface board, and the second soldering area is located outside the second soldering pad, and therefore, observation of a soldering situation between the module board and the interface board is facilitated.

When a phenomenon such as insufficient soldering and missing soldering occurs between the module board and the interface board, repair soldering may be directly performed on a soldering pad where the problem occurs. That is, the second soldering area of the first soldering pad and a side surface of the second soldering pad are connected by solder. Therefore, the repairing of the PCBA chip package module can be implemented without disassembling the entire module board, which thereby facilitates the repairing of the PCBA chip package module.

BRIEF DESCRIPTION OF THE DRAWINGS

To illustrate technical solutions in embodiments more clearly, accompanying drawings to be used for describing the embodiments or the prior art are introduced briefly in the following. Apparently, the accompanying drawings in the following description are only some embodiments, and persons of ordinary skills in the art can derive other drawings from the accompanying drawings without creative efforts.

DETAILED DESCRIPTION OF THE EMBODIMENTS

Technical solutions in the embodiments will be clearly and completely described in the following with reference to accompanying drawings in the embodiments. It is obvious that the embodiments to be described are only part rather than all of the embodiments. All other embodiments obtained by persons of ordinary skill in the art based on the embodiments without creative efforts fall within the protection scope of the claims.

The embodiments provide a PCBA chip package component and a soldering component, which can facilitate repairing of a PCBA chip package module.

Figure 1:
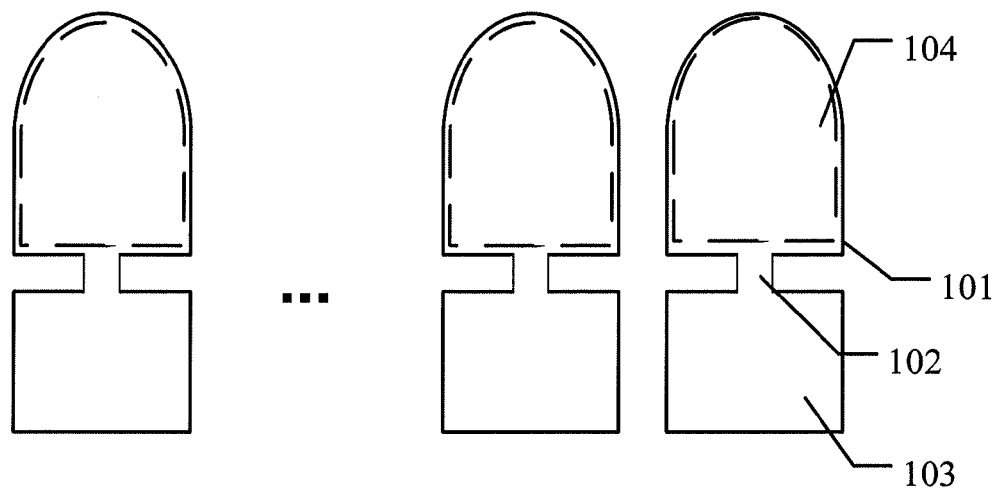
FIG. 1 is a top view of a soldering component according to an embodiment.

First, a soldering component in an embodiment is introduced. Referring to FIG. 1, the soldering component in the embodiment includes:

a first soldering pad and a second soldering pad 104, where the second soldering pad 104 is of a castle-type structure;

The first soldering pad includes a first soldering area 101, a second soldering area 103, and a connection bridge 102 that connects the first soldering area 101 and the second soldering area 103.

The first soldering area 101 corresponds to a top surface of the second soldering pad 104, and when the first soldering area 101 is soldered to the second soldering pad 104, the second soldering area 103 is located outside the second soldering pad 104.

It should be noted that, in this embodiment, the size and shape of the second soldering pad 104 may be substantially the same as those of the first soldering area 101 of the first soldering pad. The first soldering area 101 of the first soldering pad in this embodiment may be a semi-ellipse or a rectangle, or be in other shapes, which is not specifically limited herein.

Figure 2:
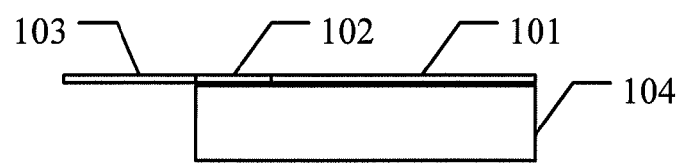
FIG. 2 is a side view of a soldering component according to an embodiment.

In order to facilitate understanding, the soldering component in this embodiment is described in a direction of a section view in the following. Referring to FIG. 2, the first soldering area 101 of the first soldering pad corresponds to the top of the second soldering pad 104, and the shapes and areas are similar. However, when the second soldering pad 104 is soldered to the first soldering area 101 of the first soldering pad, the second soldering area 103 of the first soldering pad is located outside the second soldering pad 104, that is, is exposed beyond the second soldering pad 104 and not covered.

When a phenomenon such as insufficient soldering and missing soldering occurs between the first soldering area 101 of the first soldering pad and the second soldering pad 104, the second soldering area 103 of the first soldering pad and a side surface of the second soldering pad 104 may be connected by solder. The connection bridge 102 exists between the first soldering area 101 and the second soldering area 103 of the first soldering pad, so soldering of the first soldering pad and the second soldering pad 104 may also be completed by directly performing repair soldering on the second soldering area 103 and the side surface of the second soldering pad 104, and therefore, repair soldering can be performed conveniently. That is, the second soldering area 103 of the first soldering pad and the side surface of the second soldering pad 104 are connected by the solder. Therefore, the repairing of the PCBA chip package module can be implemented without disassembling the entire module board, which thereby facilitates the repairing of the PCBA chip package module.

In this embodiment, when the first soldering area 101 of the first soldering pad is of a semi-elliptic structure, its outer edge is smooth, it is not likely to cause accumulation of the solder tin, and therefore, solder bridge between soldering pads is effectively avoided during soldering.

Figure 3:
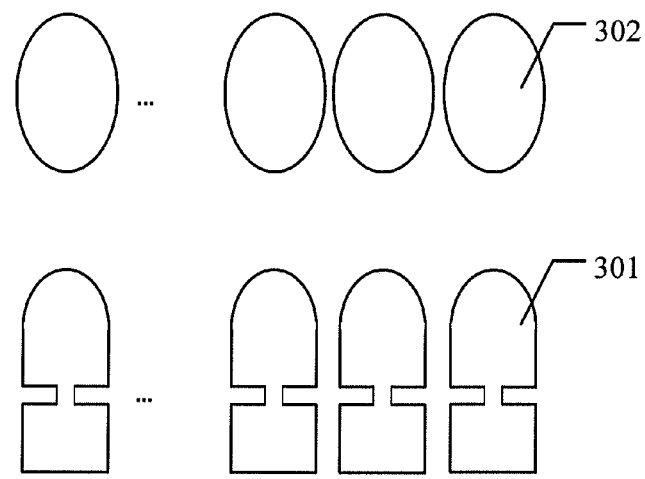
FIG. 3 is a schematic diagram of another embodiment of a soldering component according to an embodiment.

The soldering component described in FIG. 1 and FIG. 2 is single ring soldering. In practical applications, in order to increase the level of integration, more pins may be set. Accordingly, the soldering component in this embodiment may also provide more rings of soldering pads, which may specifically be shown in FIG. 3. A soldering pad 301 may be used as an inner ring soldering pad, and a soldering pad 302 may be used as an outer ring soldering pad. The soldering pad 302 may be configured to be of an elliptic structure, so as to improve the soldering effect, and avoid the solder bridge between soldering pads as much as possible.

The foregoing illustration is provided with two rings of soldering pads being an example. In practical applications, more rings of soldering pad may exist, which is not specifically limited herein.

Figure 4:
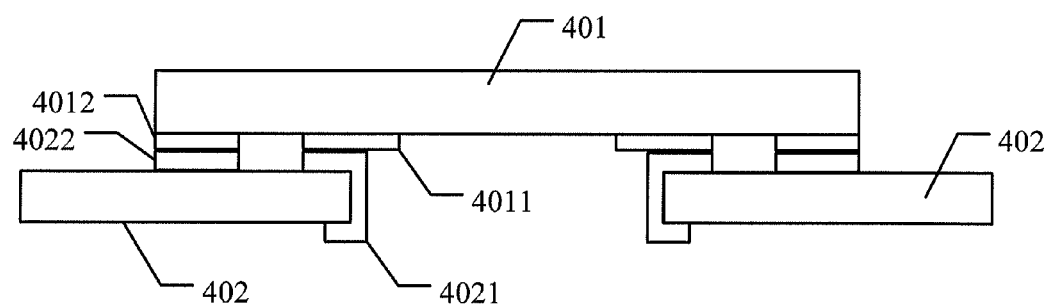
FIG. 4 is a schematic diagram of a PCBA chip package component according to an embodiment.

The soldering component in the embodiment is introduced above. In practical applications, different soldering pads of the soldering component may be located on different circuit boards. A PCBA chip package component to which the foregoing soldering component is applied is illustrated with reference to a specific example in the following. Referring to FIG. 4, the PCBA chip package component in the embodiments includes:

a module board 401 and an interface board 402.

A first soldering pad 4011 is set on the bottom of the module board 401, a second soldering pad 4021 is set on top of the interface board, and the second soldering pad 4021 is of a castle-type semi-hole structure.

It should be noted that, the castle-type semi-hole structure of the second soldering pad 4021 is the same as a castle-type semi-hole structure in the prior art, which is not described again herein.

The first soldering pad 4011 includes a first soldering area, a second soldering area, and a connection bridge that connects the first soldering area and the second soldering area, and the specific structure may be as the content shown in FIG. 1.

The first soldering area corresponds to a top surface of the second soldering pad 4021, and when the first soldering area is soldered to the second soldering pad 4021, the second soldering area is located outside the second soldering pad 4021 and the second soldering area may be connected to a side surface of the second soldering pad 4021 by solder.

In this embodiment, the first soldering pad 4011 may be an inner ring soldering pad of the module board 401, that is, the module board 401 may also include an outer ring soldering pad, that is, a third soldering pad 4012. Accordingly, a fourth soldering pad 4022 corresponding to the third soldering pad 4012 may also be set on the interface board 402.

In this embodiment, the first soldering area of the first soldering pad 4011 may be a semi-ellipse, and the third soldering pad 4012 and the fourth soldering pad 4022 may be ellipses. The outer edge of an ellipse is smooth, it is not likely to cause accumulation of the solder, and therefore, solder bridge between soldering pads is effectively avoided during soldering.

The foregoing illustration is provided with only two rings of soldering pads being an example. In practical applications, more rings of soldering pads may exist, which is not specifically limited herein.

The third soldering pad 4012 and the fourth soldering pad 4022 in the embodiments may be castle-type soldering pads, or LGA soldering pads in practical applications, which is not specifically limited herein.

When reflow soldering is performed on the module board 401 and the interface board 402, the module board 401 may have a certain level of warping, which may lower the soldering quality. However, the castle-type soldering pad is an embedded pad. When the third soldering pad 4012 and the fourth soldering pad 4022 are castle-type soldering pads, the position of the module board 401 and that of the interface board 402 may be fixed relative to each other, so that the warping is not likely to occur, and therefore the soldering quality may be improved.

In another aspect, the larger an area of the module board 401 is, the higher the level of warping is during the reflow soldering of the module board 401. Two rings of castle-type soldering pad may effectively avoid the warping, so the area of the module board 401 may be increased so as to increase the level of integration.

In this embodiment, when the reflow soldering is performed on the module board 401 and the interface board 402, a pressing block may be used on the module board 401 to further reduce the warping during the soldering, so as to further improve the soldering quality.

In this embodiment, the first soldering pad on the bottom of the module board is divided into two soldering areas, where the first soldering area is soldered to the top surface of the second soldering pad on top of the interface board, and the second soldering area is located outside the second soldering pad, and therefore, observation of a soldering situation between the module board and the interface board is facilitated.

When a phenomenon such as insufficient soldering and missing soldering occurs between the module board and the interface board, repair soldering may be directly performed on the soldering pads where the problem occurs, that is, the second soldering area of the first soldering pad and the side surface of the second soldering pad are connected by the solder. Therefore, the repairing of the PCBA chip package module can be implemented without disassembling the entire module board, which thereby, facilitates the repairing of the PCBA chip package module.

In this embodiment, the third soldering pad 4012 may be of an elliptic structure, and the first soldering area of the first soldering pad 4011 may be of a semi-elliptic structure. The outer edge of an ellipse is smooth, so that it is not likely to cause accumulation of the solder, and therefore, solder bridge between soldering pads may be effectively avoided during soldering.

The PCBA chip package component and the soldering component provided by the present invention are introduced above in detail. According to the ideas of the embodiments, persons of ordinary skill in the art can make variations to the present invention in terms of the specific implementations and application scopes. To sum up, the content of the specification shall not be construed as limitations on the present invention.

The foregoing described embodiments are merely exemplary and are not intended to limit the protection scope of the claims. Any change or replacement that can be thought of by persons skilled in the art within the technical scope disclosed is considered to fall within the protection and scope of the claims.

What is claimed is:

1. A printed circuit board assembly chip package component, comprising:
   a module board; and
   an interface board;
   a first soldering pad arranged on a bottom surface of the module board, wherein the first soldering pad comprises a first soldering area, a second soldering area, and a connection bridge that connects the first soldering area and the second soldering area;
   a second soldering pad arranged on a top surface of the interface board; and
   wherein the first soldering area of the first soldering pad is positioned to register with a top surface of the second soldering pad, and when the first soldering area is soldered to the second soldering pad, the second soldering area of the first soldering pad is located outside the second soldering pad, and the second soldering area is not overlapped by the interface board.

2. The printed circuit board assembly chip package component according to claim 1, wherein
   the second soldering area is connected with a side surface of the second soldering pad by solder.

3. The printed circuit board assembly chip package component according to claim 2, wherein the first soldering area of the first soldering pad has a semi-ellipse shape.

4. The printed circuit board assembly chip package component according to claim 1, wherein
   the first soldering pad is an inner ring soldering pad, a third soldering pad is set on the bottom of the module board, and the third soldering pad is an outer ring soldering pad.

5. The printed circuit board assembly chip package component according to claim 4, wherein the first soldering area of the first soldering pad has a semi-ellipse shape.

6. The printed circuit board assembly chip package component according to claim 4, wherein the third soldering pad has an ellipse shape.

7. The printed circuit board assembly chip package component according to claim 4, wherein a fourth soldering pad is set on top of the interface board and is positioned to register with the third soldering pad.

8. The printed circuit board assembly chip package component according to claim 7, wherein the third soldering pad and the fourth soldering pad are comprises land grid array-type soldering pads.

9. The printed circuit board assembly chip package component according to claim 1, wherein the first soldering area of the first soldering pad has a semi-ellipse shape.

10. A soldering component, comprising:
    a first module board with a surface having a first soldering pad that comprises a first soldering area, a second soldering area, and a connection bridge that connects the first soldering area and the second soldering area; and
    a second module board with a surface having a second soldering pad;
    wherein the first soldering area of the first module board is positioned to register with a top surface of the second soldering pad of the second module board, and when the first soldering area is soldered to the second soldering pad, the second soldering area is located outside the second soldering pad, and the second soldering area is not overlapped by the second module board.

11. The soldering component according to claim 10, wherein
    the second soldering area is connected with a side surface of the second soldering pad by solder.

12. The soldering component according to claim 10, wherein the first soldering area of the first soldering pad has a semi-ellipse shape.

* * * * *